United States Patent
Asulin et al.

(10) Patent No.: US 11,189,451 B2
(45) Date of Patent: Nov. 30, 2021

(54) CHARGED PARTICLE BEAM SOURCE AND A METHOD FOR ASSEMBLING A CHARGED PARTICLE BEAM SOURCE

(71) Applicant: APPLIED MATERIALS ISRAEL LTD., Rehovot (IL)

(72) Inventors: Itay Asulin, Rehovot (IL); Ofer Yuli, Rehovot (IL); Lavy Shavit, Rehovot (IL); Yoram Uziel, Misgav (IL); Guy Eytan, Kidron (IL); Natan Schlimoff, Rehovot (IL); Igor Krivts (Krayvitz), Rehovot (IL); Jacob Levin, Rehovot (IL); Israel Avneri, Ramat-Gan (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 17/110,167

(22) Filed: Dec. 2, 2020

(65) Prior Publication Data

US 2021/0175040 A1    Jun. 10, 2021

Related U.S. Application Data

(63) Continuation of application No. 16/839,986, filed on Apr. 3, 2020, now Pat. No. 10,886,092, which is a continuation of application No. PCT/US2018/064991, filed on Dec. 11, 2018.

(60) Provisional application No. 62/598,385, filed on Dec. 13, 2017.

(51) Int. Cl.
| | |
|---|---|
| *H01J 1/92* | (2006.01) |
| *H01J 1/304* | (2006.01) |
| *H01J 9/02* | (2006.01) |
| *H01J 9/18* | (2006.01) |

(52) U.S. Cl.
CPC ........... *H01J 1/92* (2013.01); *H01J 1/304* (2013.01); *H01J 9/025* (2013.01); *H01J 9/18* (2013.01)

(58) Field of Classification Search
CPC .... H01J 1/92; H01J 1/304; H01J 9/025; H01J 9/18
See application file for complete search history.

(56) References Cited

U.S. PATENT DOCUMENTS

| | | | | |
|---|---|---|---|---|
| 4,567,398 A | ‡ | 1/1986 | Ishitani | H01J 27/26 250/423 R |
| 2006/0226753 A1 | ‡ | 10/2006 | Adamec | H01J 37/242 313/31 |
| 2010/0012839 A1 | ‡ | 1/2010 | Notte, IV | H01J 27/024 250/30 |

(Continued)

OTHER PUBLICATIONS

PCT/US2018/064991, "International Search Report and Written Opinion", dated Apr. 22, 2019, 14 pages.‡

(Continued)

*Primary Examiner* — Joseph L Williams
(74) *Attorney, Agent, or Firm* — Kilpatrick Townsend & Stockton LLP

(57) ABSTRACT

A charged particle beam source that may include an emitter that has a tip for emitting charged particles; a socket; electrodes; a filament that is connected to the electrodes and to the emitter; electrodes for providing electrical signals to the filament; a support element that is connected to the emitter; and a support structure that comprises one or more interfaces for contacting only a part of the support element while supporting the support element.

20 Claims, 7 Drawing Sheets

(56) References Cited

U.S. PATENT DOCUMENTS

2011/0006209 A1‡ 1/2011 Yoshikawa ........... H01J 37/244
                                                        250/31
2013/0049568 A1‡ 2/2013 Nonogaki ............... H01J 37/06
                                                        313/31
2015/0008342 A1‡ 1/2015 Notte, IV ................. G21K 5/04
                                                        250/49

OTHER PUBLICATIONS

PCT/US2018/064991, "International Preliminary Report on Patentability", dated Jun. 25, 2020, 9 pages.‡
U.S. Appl. No. 16/839,986, "Non-Final Office Action", dated Jul. 22, 2020, 9 pages.
U.S. Appl. No. 16/839,986, "Notice of Allowance", dated Oct. 22, 2020, 10 pages.

‡ imported from a related application

CHARGED PARTICLE BEAM SOURCE AND A METHOD FOR ASSEMBLING A CHARGED PARTICLE BEAM SOURCE

CROSS REFERENCE TO RELATED APPLICATIONS

This application is a continuation of U.S. application Ser. No. 16/839,986, filed Apr. 3, 2020; which claims priority to and is a continuation of International patent Application No. PCT/US2018/064991, filed Dec. 11, 2018; which claims priority from U.S. Provisional Patent Application No. 62/598,385 filed Dec. 13, 2017. The entire contents of the PCT/US2018/064991 and 62/598,385 applications are incorporated by reference herein in their entirety for all purposes.

FIELD OF THE INVENTION

The present invention relates to electron sources, and in particular to a decrease of the amplitude vibration of an emitter tip, and more particularly to a cold field emission electron source for application in focused electron beam systems.

BACKGROUND OF THE INVENTION

Electron beam apparatuses are used in many fields of industry, including, but not limited to high resolution metrology and inspection systems, exposure systems for lithography, detection apparatus, testing devices and others.

The generation of an electron beam is the first phase in these electron beam apparatuses.

Various types of electron sources are usually used in an electron beam apparatus. There are thermionic cathodes, Schottky emitters, and cold field emitters (CFE).

CFE electron sources offers several advantages over other techniques. The low energy spread of the CFE electron sources allows to improve the resolution of the electron beam apparatuses. Moreover, the brightness of the CFE electron sources is much higher than other electron sources due to the smaller virtual source size.

The brightness of CFE electron sources is three orders of magnitude higher than thermionic and one order of magnitude higher than Schottky emitter. In addition, the CFE electron sources has a very long life.

An isometric view of a prior art CFE electron source 10 is shown in FIG. 1.

CFE electron source 10 includes filament 2 that supports and heats an emitter 3 having a tip 4 from which the electrons are emitted. Tip 4 has as small (nanometric scale) radius.

A heating current can be supplied to filament 2 through electrodes 5 that are mounted on an insulated (ceramic material) socket.

The heating current is supplied during a heating process that is used in cases that the electron emitter requires heat for normal operation, for cleaning, for processing or for other reasons. For example, the emitter 3 is heated periodically that provide cleaning (flashing) of the tip surface for stabilization of the electron emission process. Emitter 3 usually made of single crystal of a tungsten, tantalum, rhenium, molybdenum, iridium, other similar metals, or alloys of these metals.

One of the disadvantages of the CFE electron sources is mechanical vibrations of the emitter 3. Such vibrations significantly limit the achievable resolution of the electron beam apparatuses. The frequencies of these vibrations are in the kHz range and may result in deflections of the electron beam having amplitudes of several nanometers can occur.

It has been found that the resonance frequency of the CFE electron source was few kilohertz (for example—2845 kilohertz) meaning that ambient sound waves cause the CFE electron source to vibrate.

There is a growing need to provide a very stable CFE electrons source, especially to systems with a sub-nanometer performance.

SUMMARY OF THE INVENTION

There may be provided a col field emitter and a method for assembling the cold field emitter.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof may best be understood by reference to the following detailed description when read with the accompanying drawings in which:

Figure 1:
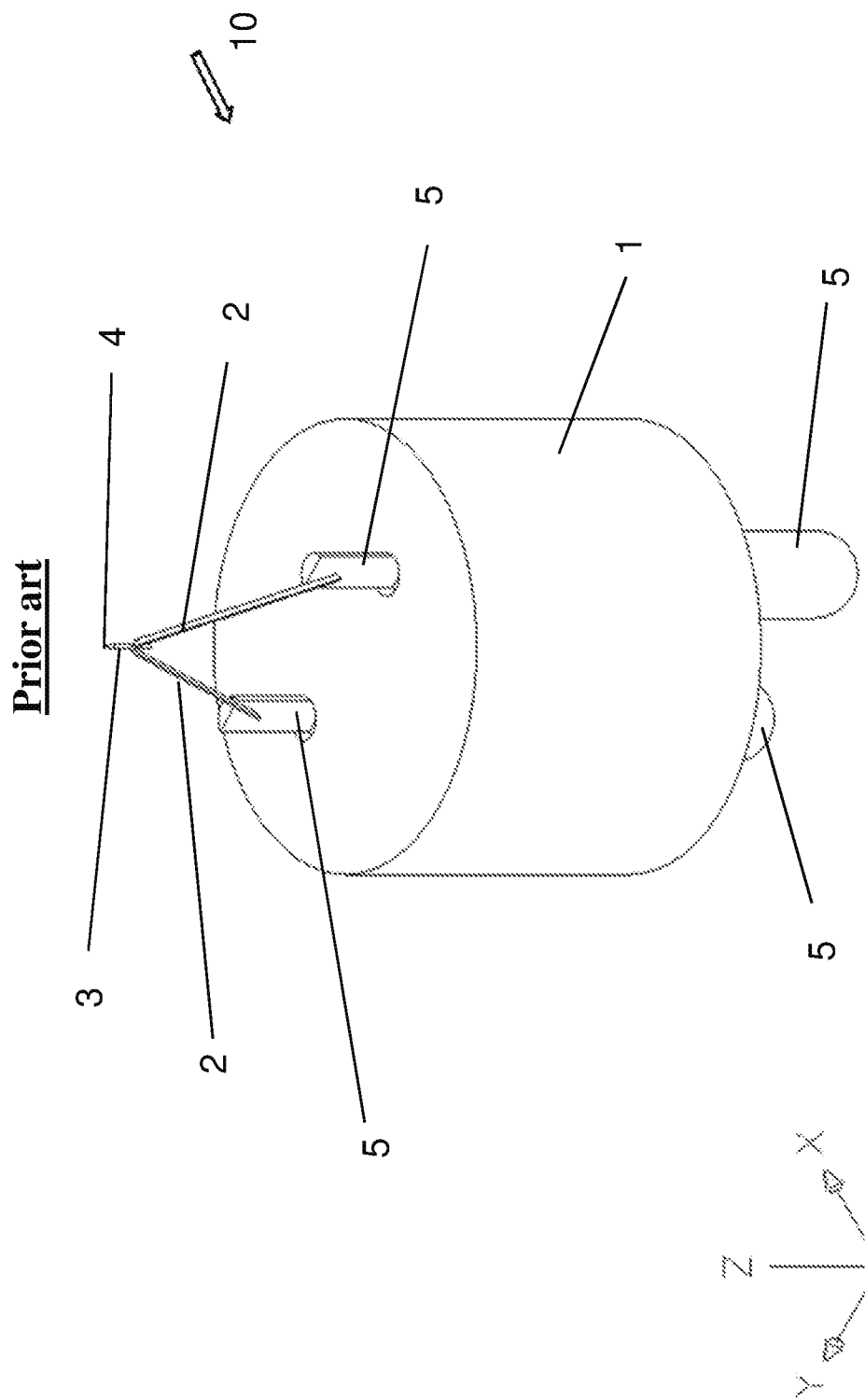
FIG. 1 shows an isometric view of a prior art CFE electron source.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF SOME EMBODIMENTS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention. The assignment of the same reference numbers to various components may indicate that these components are similar to each other.

Figure 2:
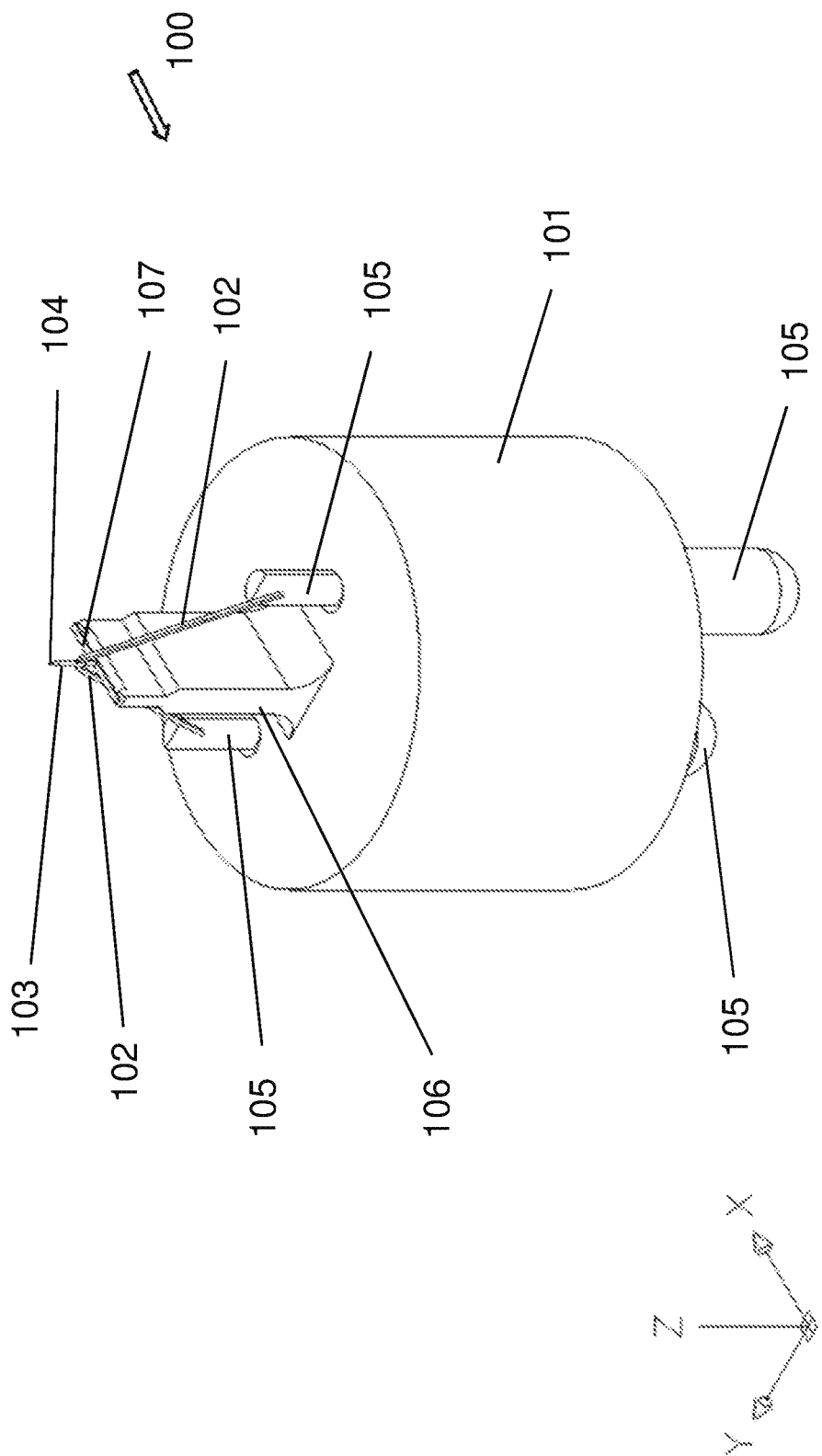
FIG. 2 shows an isometric view of an example a CFE electron source.

FIG. 2 illustrates an isometric view of an example of a charged particle beam source such as CFE electron source 100 that includes an additional support of the electron emitter. The CFE electron source 100 includes of ceramic socket 101, filament 102 that supports and heats an emitter 103 having a tip 104 from which the electrons are emitted.

Tip 104 may have a smallest possible radius—but this is not necessarily so.

A heating current can be supplied to filament 102 through electrodes 105 that are mounted on an insulated socket such as ceramic socket 101.

A heating process is used in cases that the electron emitter requires heat for normal operation, for cleaning, for processing or for other reasons.

The ceramic socket 101 has a ceramic tip support 106 that is an integral part of the ceramic socket 101. The emitter 103 is connected to a support element such as emitter beam 107 that may be connected by spot welding. The emitter beam 107 is a non-limiting example of a support element.

The emitter beam 107 is supported by two ends on the ceramic tip support 106. Filament 102 is jointed to the electrodes 105, for example, by spot welding. Additional support of the emitter 103 allows increasing the rigidity of the structure, an increase in the resonance frequency and a reduction of the amplitude of the resonant oscillations.

Figure 3:
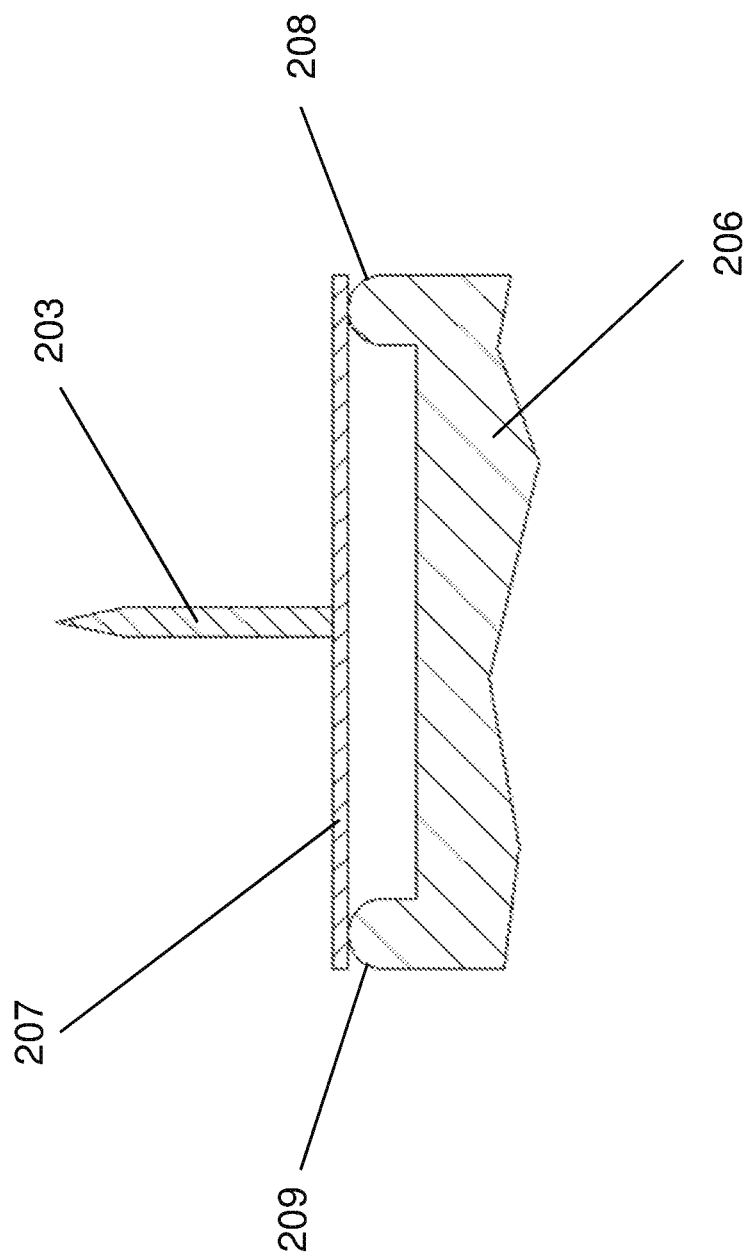
FIG. 3 shows a partial cross section an example a CFE electron source.

FIG. 3 illustrates a partial cross section view of an example of CFE electron source 100 with support 208 and support 209 of the electron emitter 203. Support 208 and support 209 are integrated part of the tip support 206. Support 208 and support 209 may be cylindrical supports.

The emitter beam 207 is connected to the electron emitter 203 by spot welding, for example.

The filament heats the tip during the cleaning process. The filament heats the emitter and the emitter beam. The emitter and the emitter beam expand when heated and then shrink after the heating process ends. The expansion and shrinking of the emitter beam causes the emitter beam to move in relation to support 208 and support 209. These movements should not be hampered by support 208 and support 209. Accordingly—it may be beneficial to minimize (or otherwise reduce) the friction force between emitter beam 207, support 208 and support 209.

The friction may be reduced by coating the surface of support 208 and support 209 by DLC (Diamond Like Carbon) and/or by any other manner. The DLC coating provides a high surface hardness, low friction coefficient, high wear resistance and compatibility to an ultra-high vacuum (UHV) environmental. However, such coating may be used up to 500° C. temperature. For high temperature applications can be used titanium nitride (TiN) or chromium nitride (CrN) coatings, for example.

Table 1 presents results of modal analysis (Finite Element Analysis by ANSYS simulation tool) of the CFE electron source 100 that has support 208 and support 209.

| Modes | Natural Frequency (Hz) | Tip Operating Deflection Shape |
|---|---|---|
| First | 19335 | Along the X-axis |
| Second | 19425 | Along the Y-axis |
| Third | 19630 | Around the Z-axis |
| Fourth | 22528 | Along the X-axis |
| Fifth | 35978 | Along the X-axis |
| Sixth | 38446 | Around the Z-axis |

The first mode of the natural frequency increases by factor around 6.5, which reduces the amplitude of the resonance oscillations by approximately factor 40.

Figure 4:
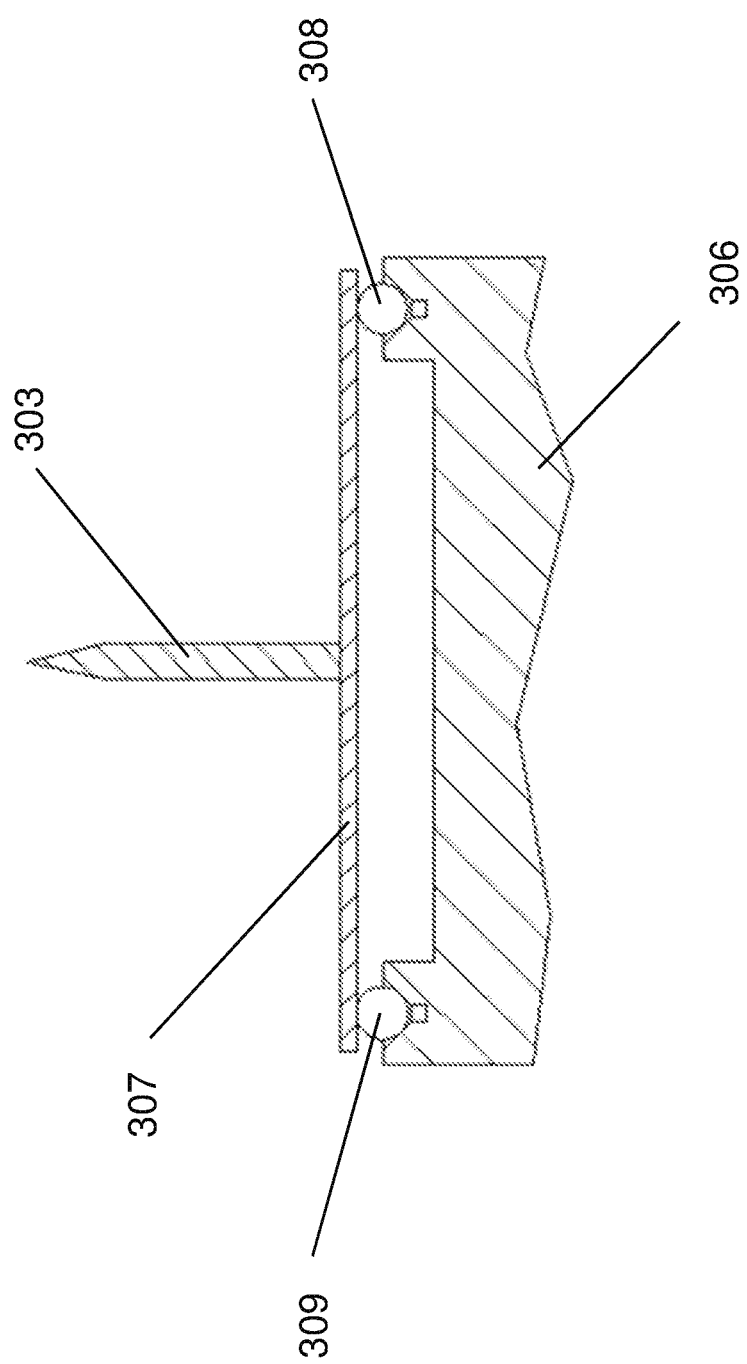
FIG. 4 shows a partial cross section view of an example a CFE electron source.

FIG. 4 illustrates a partial cross section view of an example CFE electron source 100 with spherical support (such as spherical support 308 and spherical support 309) of the emitter 303. Spherical support 308 and Spherical support 309 are made of sapphire, for example, that provides ability to operate with low friction force, high wear resistance in UHV environmental and high temperature.

Spherical support 308 and spherical support 309 are mounted into conical pocket on the tip support 306. Such design allows getting a minimum of the heat transfer from emitter beam 307 to tip support 306 (because, in this case, the theoretical contact between spherical supports 308 and 309 and tip support 306 is a point), which is stabilized the emitter 303 temperature. The emitter beam 307 is connected to the emitter 303 by spot welding, for example.

The filament that that supports and heats an emitter 303 the is not shown for brevity of explanation. The natural frequencies of the emitter 303 are closed to the results indicated in Table 1.

Figure 5:
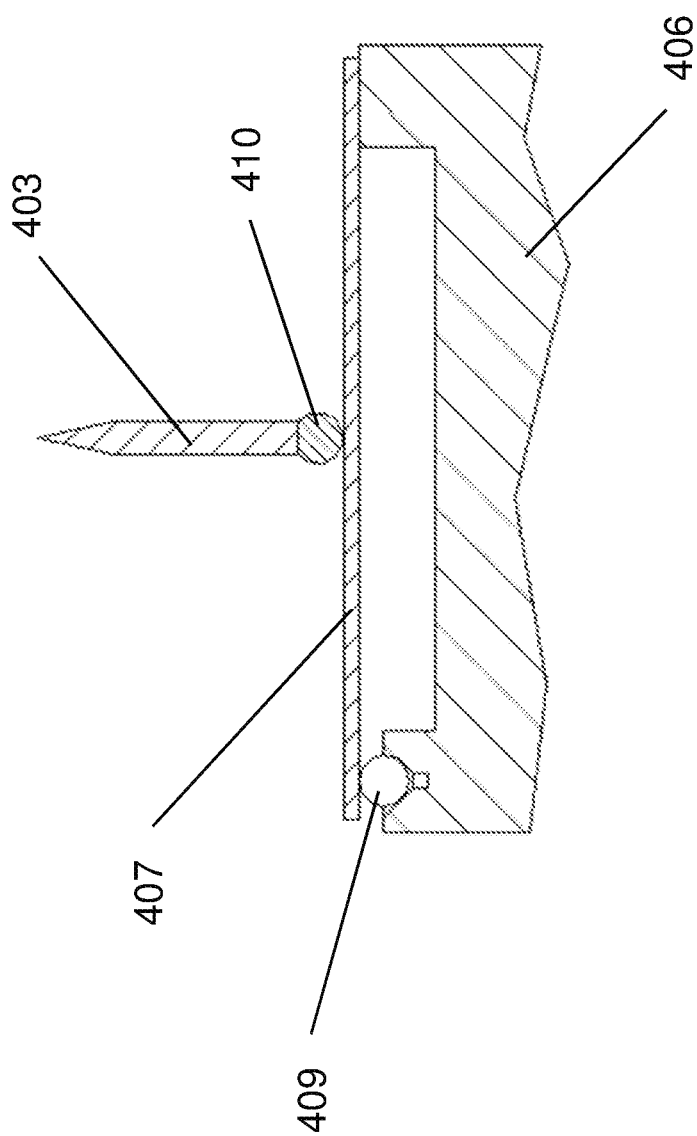
FIG. 5 shows a partial cross section view of an example a CFE electron source.

Other schematic partial cross section view of an example of CFE electron source 100 is shown in FIG. 5. Here, the emitter 403 has spherical support 410, which is connected to the emitter 403 by welding. Supporting surface of emitter 403 may be shaped as a sphere curve.

The emitter 403 (via spherical support 410) may freely support the emitter beam 407. The emitter beam 407 at one end is rigidly connected (for example, by brazing or soldering) to the tip support 406, while the other end of the emitter beam 407 is supported by spherical support 409, which is mounted into conical pocket of the tip support 406.

The spherical support 409 may be made of sapphire—that provides ability to operate with low friction force, high wear resistance in UHV environmental and high temperature.

This design has very small contact area between emitter 403 and emitter beam 407—this minimizes heat transfer between these parts. The filament that that supports and heats an emitter 403 doesn't show here for brevity of explanation.

The natural frequencies of the electron emitter 403 are closed to the results indicated in Table 1.

Figure 6:
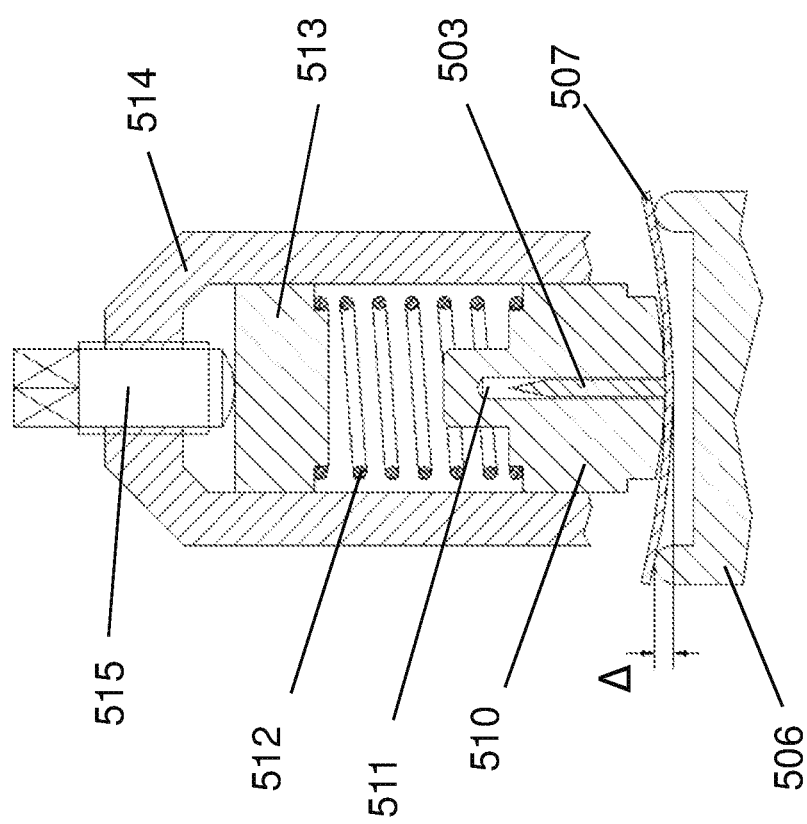
FIG. 6 shows a cross section view of an example of a jig for assembling a CFE electron source.

FIG. 6 shows a schematic diagram of the partial cross section view of an example of an adjustment jig for assembling CFE electron source 100.

The adjustment jig includes an adjustable plunger 510 with central hole 511, helical spring 512, spring plunger 513, housing 514 and adjusting screw 515.

The housing 514 is mounted on the ceramic socket (not shown in FIG. 6) and emitter 503 is situated within the central hole 511 of the adjustable plunger 510.

Adjusting screw 515 moves the spring plunger 513 and compresses the helical spring 512, and this changed the force of pressing the adjustable plunger 510 onto emitter beam 507 that is supported by cylindrical supports of the tip support 506, for example.

Thus, the necessary amount of deflection A is regulated. The deflection A may be measurement by optical, electronic or mechanical instruments. The value of the deflection A may depend on the geometrical parameters of the system (for example, emitter, emitter beam and filament). The deflection A of the emitter beam may ensure constant contact between the emitter beam and its supports both under normal operating conditions, so during the heating of the emitter, when the system components are expanded.

The adjustment and assembly of the Cold Field Emitter electron source performs by the following procedure:

a. Mount of the emitter with emitter beam on the adjustment jig (emitter is situated within the jig central hole, the emitter beam is contacted with adjustable plunger).

b. Mount of the jig with emitter and emitter beam on the socket.

c. Rigidly fix the whole structure on the socket.

d. Set the necessary amount of deformation A.

e. Weld the filament to the electrodes.

f. Dismount the jig from socket.

Figure 7:
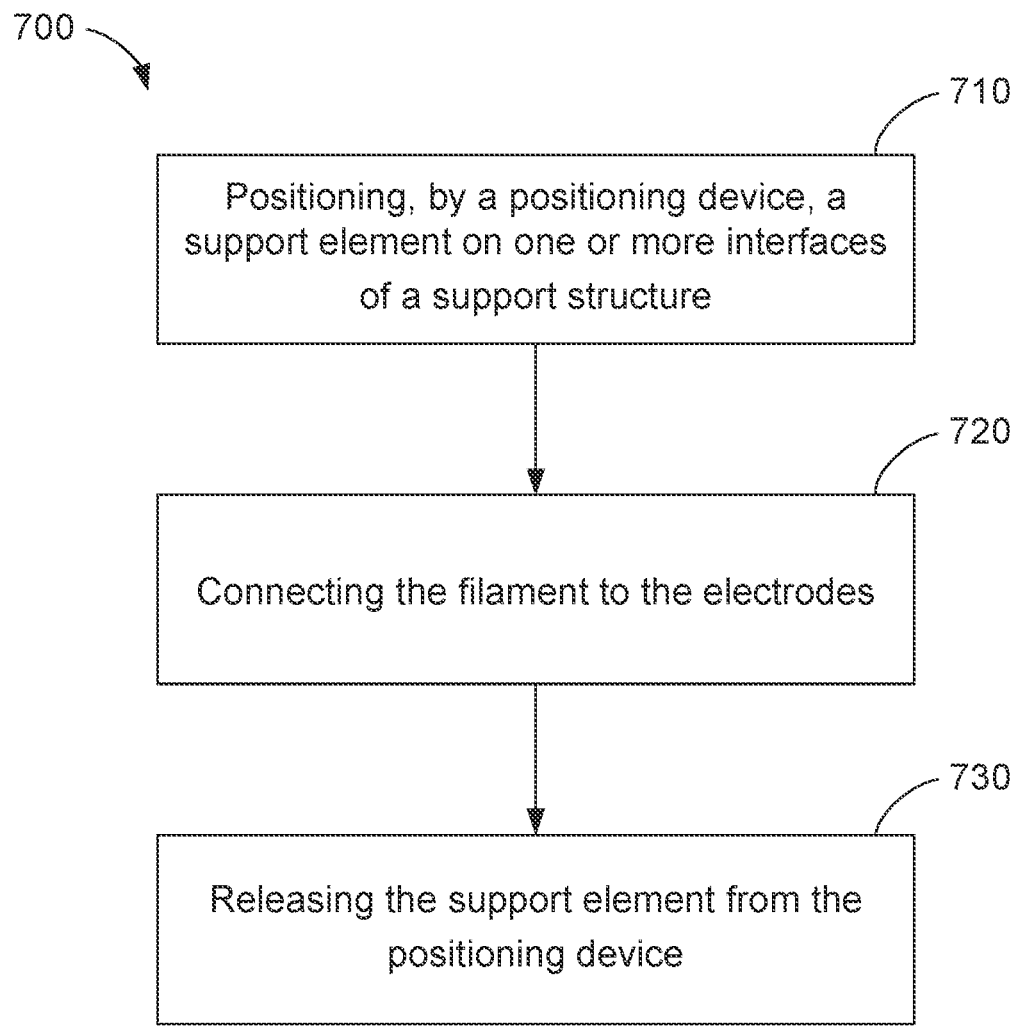
FIG. 7 illustrates an example of a method.

FIG. 7 illustrates an example of method 700.

Method 700 is for assembling a charged particle beam source.

Method 700 may start by step 710 of positioning, by a positioning device, a support element on one or more interfaces of a support structure. The support element belongs to a charged particle beam source and is connected to an emitter that has a tip for emitting charged particles. The charged particle beam source may also include a socket, electrodes, a filament that is connected to the emitter and electrodes for providing electrical signals to the filament.

Step 710 may be followed by step 720 of connecting the filament to the electrodes.

Step 720 may be followed by step 730 of releasing the support element from the positioning device.

Step 710 may include at least one out of:

g. Bending the support element towards the support structure.

h. Connecting the support element to only a single point of the support structure.

Step 710 may exclude connecting the support element to the support structure.

Step 720 may include welding the filament to the electrodes.

The term "comprising" is synonymous with (means the same thing as) "including," "containing" or "having" and is inclusive or open-ended and does not exclude additional, unrecited elements or method steps.

The term "consisting" is a closed (only includes exactly what is stated) and excludes any additional, unrecited elements or method steps.

The term "consisting essentially of" limits the scope to specified materials or steps and those that do not materially affect the basic and novel characteristics.

In the claims and specification any reference to the term "comprising" (or "including" or "containing") should be applied mutatis mutandis to the term "consisting" and should be applied mutatis mutandis to the phrase "consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A charged particle beam source comprising:
a ceramic socket;
first and second electrodes coupled to the ceramic socket and spaced apart from each other;
an emitter brace integrally formed with the ceramic socket and disposed between the first and second electrodes, the emitter brace comprising a body extending away from the ceramic socket towards a distal end;
an emitter support element coupled to the distal end of the emitter brace;
an emitter coupled to the emitter support element and including a tip for emitting charged particles;
a filament coupled to the first and second electrodes and to the emitter, wherein the first and second electrodes are configured to provide electrical signals to the filament.

2. The charged particle beam source according to claim 1 wherein the first and second electrodes extend through apertures formed in the ceramic socket.

3. The charged particle beam source according to claim 1 wherein the filament comprises a first filament element that is connected to the first electrode and a second filament element that is connected to the second electrode.

4. The charged particle beam source according to claim 1 wherein a longitudinal axis of the emitter brace is parallel to a longitudinal axis of the tip.

5. The charged particle beam source according to claim 1 further comprising first and second supports disposed at the distal end of the emitter brace and spaced apart from each other defining a gap there between, and wherein the emitter support element is coupled to the emitter brace through the first and second supports.

6. The charged particle beam source according to claim 5 wherein the emitter support element spans the gap between the first and second supports.

7. The charged particle beam source according to claim 6 wherein the emitter support element is a beam that has a longitudinal axis that is orthogonal to an imaginary plane defined by the filament.

8. The charged particle beam source according to claim 5 wherein the first and second supports comprise one or more movable elements that are movably coupled to a body of the emitter brace.

9. The charged particle beam source according to claim 5 wherein the first and second supports comprise one or more movable spheres that are movably coupled to a body of the emitter brace.

10. The charged particle beam source according to claim 5 wherein the first and second supports comprise one or more thermal isolators.

11. The charged particle beam source according to claim 5 wherein first and second supports extend beyond an intermediate part of the emitter brace thereby defining a gap between the intermediate part and the emitter support element when the emitter support element is supported by the emitter brace.

12. The charged particle beam source according to claim 5 wherein the emitter support element is coated with diamond like carbon where the first and second supports are coupled to the emitter support.

13. The charged particle beam source according to claim 1 wherein the emitter brace comprises a ceramic.

14. The charged particle beam source according to claim 1 wherein a resonance frequency of the emitter exceeds ten thousand Hertz.

15. The charged particle beam source according to claim 1 wherein the emitter support element is connected to only one point of the emitter brace.

16. The charged particle beam source according to claim 1 wherein the charged particle beam source is a cold field emission charged particle beam source.

17. A cold field emission charged particle beam source comprising:
a ceramic socket;
first and second electrodes coupled to the ceramic socket and spaced apart from each other;
an emitter brace integrally formed with the ceramic socket and disposed between the first and second electrodes, the emitter brace comprising a body extending away from the ceramic socket towards a distal end;
an emitter support element coupled to the distal end of the emitter brace;
an emitter coupled to the emitter support element and including a nanometric scale radius tip for emitting charged particles;
a filament coupled to the first and second electrodes and to the emitter, wherein the first and second electrodes are configured to provide electrical signals to the filament.

18. The cold field emission charged particle beam source set forth in claim 17 wherein:
the first and second electrodes extend through apertures formed in the ceramic socket;
the filament comprises a first filament element that is connected to the first electrode and a second filament element that is connected to the second electrode; and
a longitudinal axis of the emitter brace is parallel to a longitudinal axis of the nanometric scale radius tip.

19. The cold field emission charged particle beam source set forth in claim 18 further comprising first and second supports disposed at the distal end of the emitter brace and spaced apart from each other defining a gap there between, and wherein the emitter support element spans the gap and is coupled to the emitter brace through the first and second supports.

20. A cold field emission charged particle beam source comprising:
a ceramic socket;
first and second electrodes coupled to the ceramic socket and spaced apart from each other;
a ceramic brace integral with the ceramic socket and disposed between the first and second electrodes, the ceramic brace comprising a body having a longitudinal axis and extending away from the ceramic socket to a distal end at which the ceramic brace includes first and second supports spaced apart from each other defining a gap there between;
an emitter support element comprising a beam coupled to and extending between the first and second supports at the distal end of the ceramic brace over the gap;
an emitter coupled to the emitter support element, the emitter including a nanometric scale radius emitter tip having a longitudinal axis parallel to the longitudinal axis of the ceramic brace; and
a filament coupled between the first and second electrodes and the emitter, wherein the first and second electrodes are configured to provide electrical signals to the filament.

* * * * *